(12) United States Patent
Bugeja

(10) Patent No.: US 6,906,652 B2
(45) Date of Patent: Jun. 14, 2005

(54) HIGH DYNAMIC LINEARITY CURRENT-MODE DIGITAL-TO-ANALOG CONVERTER ARCHITECTURE

(75) Inventor: Alexander Bugeja, Acton, MA (US)

(73) Assignee: Engim, Inc., Acton, MA (US)

( * ) Notice: Subject to any disclaimer, the term of this patent is extended or adjusted under 35 U.S.C. 154(b) by 0 days.

(21) Appl. No.: 10/653,710

(22) Filed: Sep. 2, 2003

(65) Prior Publication Data
US 2004/0104832 A1 Jun. 3, 2004

Related U.S. Application Data

(63) Continuation-in-part of application No. 10/652,888, filed on Aug. 29, 2003, now abandoned.
(60) Provisional application No. 60/407,845, filed on Aug. 30, 2002.

(51) Int. Cl.[7] .............................. H03M 1/66; H03M 1/80
(52) U.S. Cl. ...................................... 341/145; 341/153
(58) Field of Search ................................ 341/153, 136, 341/154, 145, 144

(56) References Cited

U.S. PATENT DOCUMENTS

| | | | | |
|---|---|---|---|---|
| 5,568,145 A | * | 10/1996 | Reynolds | ..................... 341/145 |
| 5,781,140 A | * | 7/1998 | Kao | ............................ 341/154 |
| 6,424,283 B2 | * | 7/2002 | Bugeja et al. | .............. 341/145 |
| 6,448,917 B1 | * | 9/2002 | Leung et al. | ............... 341/144 |
| 6,621,439 B1 | * | 9/2003 | Bugeja | ....................... 341/145 |
| 6,650,265 B1 | * | 11/2003 | Bugeja | ....................... 341/144 |
| 6,741,195 B1 | * | 5/2004 | Cho | ........................... 341/136 |

* cited by examiner

*Primary Examiner*—Jean Bruner Jeanglaude
(74) *Attorney, Agent, or Firm*—Hamilton, Brook, Smith & Reynolds, P.C.

(57) ABSTRACT

The present invention dramatically reduces dynamic mismatches between the different current segments of a segmented current-mode DAC. By providing substantially the same local architecture for each of the individual current segments, parasitic effects of any physical realization can be controlled. In one embodiment, the most-significant-bit (MSB) current segments and the least-significant-bit (LSB) current segments each have the same number of multiple internal current branches. In the MSB segments, the multiple internal current branches are combined at a source node; whereas, in the LSB segment, a portion of the segment current is dumped, or wasted, through at least some of the internal current branches.

35 Claims, 9 Drawing Sheets

HIGH DYNAMIC LINEARITY CURRENT-MODE DIGITAL-TO-ANALOG CONVERTER ARCHITECTURE

RELATED APPLICATION

This application is a continuation-in-part of U.S. application Ser. No. 10/652,888 filed on Aug. 29, 2003, now abandoned and claims the benefit of U.S. Provisional Application No. 60/407,845, filed Aug. 30, 2002. The entire teachings of the above applications are incorporated herein by reference.

BACKGROUND OF THE INVENTION

Producing an analog signal from a digital representation of the analog signal can be accomplished in a number of ways using systems commonly referred to as digital-to-analog converters (or DACs). DACs receive a digital word input and convert it to an analog voltage or current output. The input digital word can be a pure binary word, for example, or a binary-coded decimal word.

As the use of DACs becomes more prevalent in higher-frequency applications, the DACs dynamic linearity can become a limiting issue. Dynamic linearity refers to the DAC's ability to accurately reproduce higher-frequency analog signals. High dynamic linearity indicates that the DAC will accurately reproduce a tone; whereas, poor dynamic linearity indicates that the DAC will produce unwanted spectral components, such as harmonics in addition to the intended tone. Achieving a high dynamic linearity is particularly important in many applications, such as broadband communications.

Static linearity refers to the ability of a DAC to reproduce an, accurate analog voltage or current level in response to a received digital word. Improved static linearity can be obtained by providing a cascode device within a current leg, such as a cascode current source, or similar compensating element. The cascode device, in particular, provides an improved input impedance. Such approaches, however, generally fail to provide high dynamic linearity. An inability to realize high dynamic linearity in DAC architectures is particularly troublesome as frequencies of operation are pushed towards their limits.

One type of DAC is a current-mode DAC. These devices are widely used as they are well suited for driving resistive loads, they tend to consume less power than other alternatives, and they offer reasonable static linearity. In general, a current-mode DAC consists of an array of current sources that are individually switched on or off in response to a control input. The current source outputs can be combined to yield a total current that is proportional to the number of switched-on current sources. Generally, current-mode DACs provide a high degree of linearity at low frequencies (the static linearity condition being measured at zero frequency) but linearity drops off progressively as operational frequency increase towards the Nyquist frequency ($f_s/2$, where $f_s$ is the sampling frequency). It is this reduction in linearity at the higher operational frequencies that limits the applicability of such DACs for broadband communications.

There are few viable alternatives to current-mode architectures. For example, switched capacitor architectures have been demonstrated to a limited extent, but have not shown a superior performance to the current-mode DACs in dynamic linearity.

Current mode DACs generally provided a controllable switch at each current source to selectively switch the current source on or off. In one solution, the current source-switch combinations, or current legs, can be arranged in a parallel configuration with each current leg having the same significance (i.e., the same nominal current value). This configuration is commonly referred to as being fully "thermometer decoded." In a thermometer decoded DAC, each bit of the thermometer code controls one current source switch. One example of a thermometer decoded DAC 100 is shown in FIG. 1. The exemplary DAC 100 includes three current legs, each current leg including a respective current source 105', 105", 105'" (generally 105). Each of the current sources 105 is combined in series with a respective controllable switch 110', 110", 110'" (generally 110). Notably, as described above each of the current sources 105 provides substantially the same amount of current, $I_B$, when switched on. The switch 110 can be a series connected single-pole-single-throw switch as shown. One end of the current source 105 is connected to ground and the other end is connected to one end of the respective switch. The analog current output of each current leg is available at the other end of the respective switch 110. As described above, the switch (i.e., current leg) outputs can be connected together at one node 120. Further, the node 120 can be connected to an electrical power supply, $V_s$, through an output resistor, $R_O$. Advantageously, the combined current, $I_O$, from each of the current legs at the node 120 creates a proportional voltage $V_O$ as it flows through the output resistor $R_O$.

A digital-to-thermometer code converter 115, receives a digital word and converts the digital word to a control output. The exemplary embodiment includes three (generally, L−1) current legs. In general, a thermometer decoded DAC having L−1 current legs is capable of converting a binary input word having $\log_2\lfloor L \rfloor$ bits (e.g., 2 bits). Thus, the decoder 115 receives a 2-bit digital word (e.g., "01") and converts it to a thermometer code control output (e.g., "011"). The thermometer code control outputs, in turn, can be used to control the controllable switches. Table 1 shows the possible thermometer code control outputs for a two-bit binary input. The DAC 100 can be adapted by adding additional current legs to provide a greater dynamic range (i.e., capable of converting larger digital word). As all of the current sources are nominally identical, a fully thermometer decoded DAC offers superior dynamic performance.

TABLE 1

| Binary Input Word | Thermometer Coded Output Control |
|---|---|
| 00 | 000 |
| 01 | 001 |
| 10 | 011 |
| 11 | 111 |

Dynamic linearity is improved with an architecture that provides near ideal performance, that is, where current values of the individual current sources are accurate and stable, and switching control inputs are distributed to all current sources at precisely the same instant in time. Unfortunately, even designs that strive to meet the above goals include some imperfections due to the physical nature of the structure. That is, any physical implementation will result in unavoidable parasitic effects. These parasitic effects can lead to nonuniformities among the current sources, and/or delays in the delivery of switching control inputs of one or more of the current sources.

Some designs attempt to control the parasitic effects using a fully thermometer decoded DAC as described above.

Realizing such a design for many DAC applications, however, would, be too complex to be practical. For example, constructing a thermometer coded 12-bit DAC would require $2^{12}-1=4,095$ identical current sources. First, it is impractical to route switching control inputs to all of these current sources such that the signals arrive simultaneously. Additionally, it is impractical to construct connections from the DAC outputs to all current source outputs such that the current source outputs observe the same time constants between themselves and the DAC outputs. These complications generally lead to delays and non-uniformities that, together with other related factors, give rise to dynamic mismatches between the current sources. The dynamic mismatches, in turn, lead to poor current mode DAC dynamic linearity.

Segmentation offers one solution to reduce the complexity discussed above for current-mode DACs configured to convert large binary words. In general, a segmented DAC includes multiple segments, each segment containing one or more current sources. The segmented DAC differs from the thermometer decoded DAC in that the values of the current sources are weighted according to the different segments. For example, a two-segment DAC includes a Most-Significant-Bit (MSB) segment and a Least-Significant-Bit (LSB) segment. In general, the MSB segment includes M current sources, each capable of providing a respective current output of $I_{MSB}$. Similarly, the LSB segment includes N current sources, each capable of providing a respective current output of $I_{LSB}$. Using current sources that have different weights, the segmented DAC is capable of converting digital words using less current legs than the thermometer-decoded DAC. In general, bits are divided among the two segments such that the number of DAC bits (e.g., 12) is determined as $\log_2|M|+\log_2|N|$. Using the above 12-bit DAC example and taking 8 MSB bits and 4 LSB bits, the number of current sources required would be: $2^M-1= 2^8-1=255$ MSBs+$2^N-1=2^4-1=15$ LSBs, or 270.

Routing control inputs to the 270 current sources of the segmented DAC is by far easier than routing the 4,095 signals of the thermometer-decoded DAC. However, weighting the current sources of the different segments introduces new complications related to the dynamic range performance. These complications are primarily due to the differences in physical construction, or realization, between the differently weighted current sources. Ideally, all of the MSB current sources are nominally identical to every other MSB current source, and all of the LSB current source are nominally identical to every other LSB current source. The relative size of the current source, however, is generally proportional to the amplitude of its current. Thus, an MSB current source would be larger than an LSB current source. For example, considering the segmented DAC discussed above, the MSB current sources, each provide a current of $I_{MSB}$ that is $2^4$, or 16 times larger than the current $I_{LSB}$ of the LSB current sources. It can be seen that this approach substantially reduces the complexity and practicality problems inherent in the large number of current sources of the thermometer decoded, or single segment DAC. Nevertheless, the segmented DAC is still plagued by dynamic mismatch problems. In particular, the dynamic characteristics of the N LSB current sources are quite different from those of the M LSB current sources.

SUMMARY OF THE INVENTION

The present invention provides a current mode DAC architecture that addresses the limitations of the prior art and improves upon the attainable dynamic performance from a current mode DAC.

In one aspect, the invention relates to a segmented, current-mode Digital to-Analog Converter (DAC) that includes a summing node and a dump node. A Most Significant Bit (MSB) current leg is coupled to the summing node and conducts a first current in response to a control input. Additionally, a Least Significant Bit (LSB) current leg is also coupled to the summing node, similarly conducting a second current in response to the control input. The LSB current leg, however, is further coupled to the dump node to which a portion of conducted current is directed.

A source node can be a positive source node or a negative source node, or a differential source node including both a positive and negative source nodes. The dump node can be a source (e.g., a supply plane, or supply rail). Alternatively, the dump node can be electrical ground.

Additionally, the DAC can include a decoder that receives a digital word (e.g., a binary word) and, in response, generates the control input. The decoder can, for example, produce the control input by converting the binary word with a combinational logic.

One or more additional MSB current leg can also be coupled between the source node and the summing node, representing additional MSB bits. Each additional MSB current leg similarly conducts a first current in response to a respective control input.

In one embodiment, the MSB current leg includes an MSB current source, such as a field-effect transistor (FET) and multiple internal current branches coupled between the source node and the MSB current source. In general, each, current branch conducts a respective portion of the first current. Similarly, the LSB current leg includes an LSB current source and multiple internal current branches. At least one of the LSB current branches is coupled between the source node and the LSB current source. The remaining LSB current branches are coupled between the dump node and the LSB current source. In some embodiments, the MSB and LSB current legs include the same respective number of internal current branches. The MSB and LSB current legs can optionally include respective cascode devices coupled in series to the MSB current source.

Each of the LSB current branches can include a respective LSB switch coupled between the respective node and the LSB current source. The LSB switch selectively couples the respective node to the LSB current source in response to the control input. Further, each of the MSB and LSB switches can include a transistor, such as a FET transistor switch.

In another aspect, the invention relates to a method for generating a linear, high-speed analog output signal. The method includes receiving a control input and conducting a first current in response thereto in a Most Significant Bit (MSB) current leg coupled to a summing node. A second current is similarly conducted in a Least Significant Bit (LSB) current leg coupled to the summing node. Further, the method includes dumping a portion of the second current to a dump node. Finally, the first current, the second current, and the dump current are combined at the summing node.

In some embodiments, the first and second currents can be differential-mode currents. The portion of the second current can be dumped to a supply (e.g., a supply plane or supply rail) or to electrical ground. Further, the method can include receiving a digital word, decoding the received digital word, and generating the control input in response thereto.

In some embodiments, the method further includes providing an MSB current source coupled between the source node and the summing node, dividing the several current branches coupled between the source node and the MSB current source. Further, the method includes providing an LSB current source coupled between the source node and the summing node, and dividing the second current across the several current branches. At least one of the several current branches is coupled between the source node and the LSB current source, and the remaining current branches are coupled between the dump node and the LSB current source.

The respective current branches of the MSB and LSB current legs can be switched between a conducting and non-conductive mode responsive to the control input. For example, the switching can be accomplished by controlling a transistor (e.g., a FET) switch. Additionally, the method can include coupling a respective MSB cascode device in series with each of the current legs to improve static linearity.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
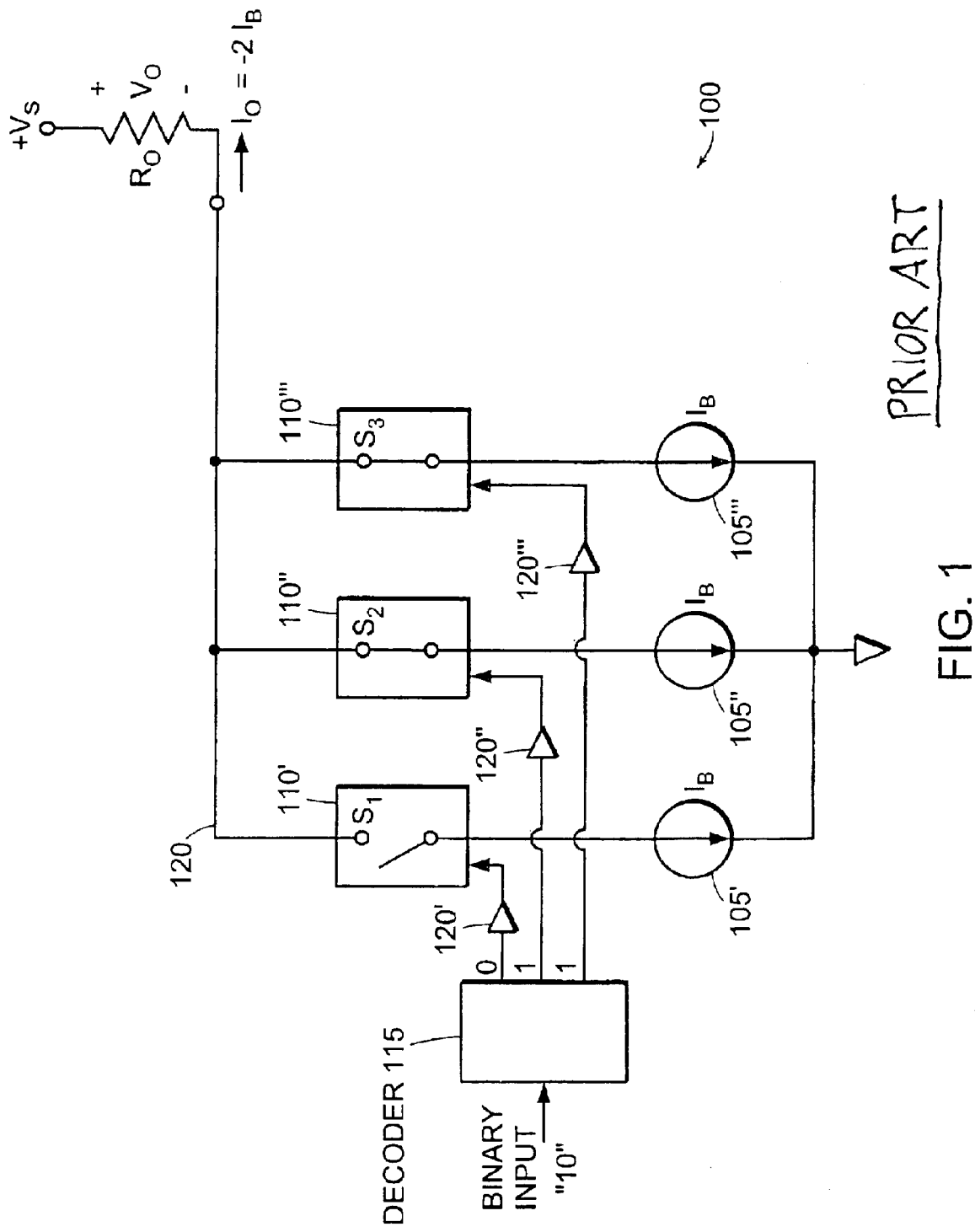
FIG. 1 is a schematic circuit diagram of an exemplary two-bit, fully thermometer decoded current-mode DAC.

A description of preferred embodiments follows.

The dynamic linearity performance of current-mode DACs are greatly enhanced by combining the advantages of segmented current-mode DACs with novel techniques to reduce mismatches resulting from using segments of different weights. The advantages are realized by using a common, scalable segment architecture that is capable of providing a selectable weighted current value. Thus, the same basic segment architecture can be used for all of the segments of a segmented DAC. This minimally complicates the MSB local segment architecture by splitting the current of each MSB current leg among multiple internal current branches. The multiple internal current branches improve commonality of the MSB current leg as they mimic the architecture of the LSB current legs. The LSB local segment architecture, similarly splits the current of each LSB current leg among multiple internal current branches. Further, a portion of the current of each LSB current leg is conducted relative to a dump node.

The overall effect is to dramatically reduce and/or eliminate the circuit mismatches, thereby improving the dynamic performance and hence the linearity of the DAC. The complications to the local architecture of the current segments and the inefficiencies of wasting a portion of the current are small prices to pay for the return of improved linearity.

As the high-dynamic linearity current-mode DAC is itself a segmented DAC, a segmented DAC, shown in FIG. 2, will first be described. An exemplary two-segment DAC 200 includes an MSB segment 201, and an LSB segment 202. Each of the segments 201, 202 includes a respective array of suitably-weighted current sources. Using the terminology discussed above, the DAC 200 includes "M" MSB current sources and "N" LSB current sources. The M current sources of the MSB segment 201 are included in the M current legs, MSB1 203' through MSBM 203" (generally 203). Generally, each current leg 203 includes a switchable MSB current source. Similarly, the LSB segment 202 includes N current legs, LSB 1 204' through LSBN 204" (generally 204), each current leg 204 including a switchable LSB current source. Those skilled in the art will understand that more segments could be present, although two or three segments is generally considered to be the practical limit.

The current legs 203, 204 are at one end coupled together and to the common electrical potential. For example, as shown the bottom ends of the current legs 203, 204 are connected to an electrical ground. Additionally, the other end the current legs 203, 204 are at the other end also connected together and to a different electrical potential. For example, as shown, the top ends of the current legs 203, 204 are connected to an electrical power source $V_s$. Connecting the top ends of the current legs 203, 204 together in this manner forms a summing node 220 at which the current contributions of the individual current legs 203, 204 is combined. A resulting total, or output current $I_o$ can then conducted between the summing node 220 and the supply $V_s$. Optionally, the device includes an output resistor $R_O$ coupled to the summing node to convert the output current $I_o$ of the current legs 203, 204 to an output voltage, $V_o$.

Each of the current legs 203, 204 receives a respective control input from a decoder 215. The control input selectively switches the respective current leg 203, 204 on and off thereby controlling its contribution to the total current $I_0$. In one embodiment, a segmented DAC decoder 215 decodes a binary input word into two different thermometer decoded outputs. For example, Table 2 provides segmented DAC decoded outputs for a two-segment DAC having M=3 MSB current legs 203 and N=3 LSB current legs. The 4 bit binary word corresponds to values, e.g., current or voltage values ranging proportionately from 0 to 15. Each of the MSB and LSB thermometer control words ranges from 0 to 3.

Thus, in a two segment DAC supporting the exemplary control inputs, the LSB control word controls three LSB current segments and the MSB control word controls three MSB current segments. Corresponding current contributions of the LSB segment varies between 0 $I_{LSB}$ and 3 $I_{LSB}$, $I_{LSB}$ being the potential current contribution of one LSB current leg. Similarly, corresponding current contributions of the MSB segment varies between 0 $I_{MSB}$ and 3 $I_{MSB}$, $I_{MSB}$ being the potential current contribution of one MSB current leg.

As described above, the current contributions of the different segments of a segmented DAC are weighted with respect to each other. Thus, $I_{MSB}$ is proportionately larger than $I_{LSB}$. In the exemplary embodiment, $I_{MSB}$ is approximately $4I_{LSB}$. Thus, a binary 0000 corresponds to $I_{MSB}=I_{LSB}=0$. As the resulting segment currents are combined at a summing node, the total output current of the DAC, $I_0$, would also be 0. Similarly, a binary 1111 corresponds to an MSB current of $3I_{MSB}$, or $12I_{LSB}$ and an LSB current of $3I_{LSB}$. The total output current $I_0$ would then be the combination of $3I_{MSB}$ and $3I_{LSB}$, or equivalently $I_0=15I_{LSB}$.

TABLE 2

Segmented DAC

| Value | Binary Word | MSB Control | LSB Control |
|---|---|---|---|
| 0 | 00 00 | 000 | 000 |
| 1 | 00 01 | 000 | 001 |
| 2 | 00 10 | 000 | 011 |
| 3 | 00 11 | 000 | 111 |
| 4 | 01 00 | 001 | 000 |
| 5 | 01 01 | 001 | 001 |
| 6 | 01 10 | 001 | 011 |
| 7 | 01 11 | 001 | 111 |
| 8 | 10 00 | 011 | 000 |
| 9 | 10 01 | 011 | 001 |
| 10 | 10 10 | 011 | 011 |
| 11 | 10 11 | 011 | 111 |
| 12 | 11 00 | 111 | 000 |
| 13 | 11 01 | 111 | 001 |
| 14 | 11 10 | 111 | 011 |
| 15 | 11 11 | 111 | 111 |

Figure 3A:
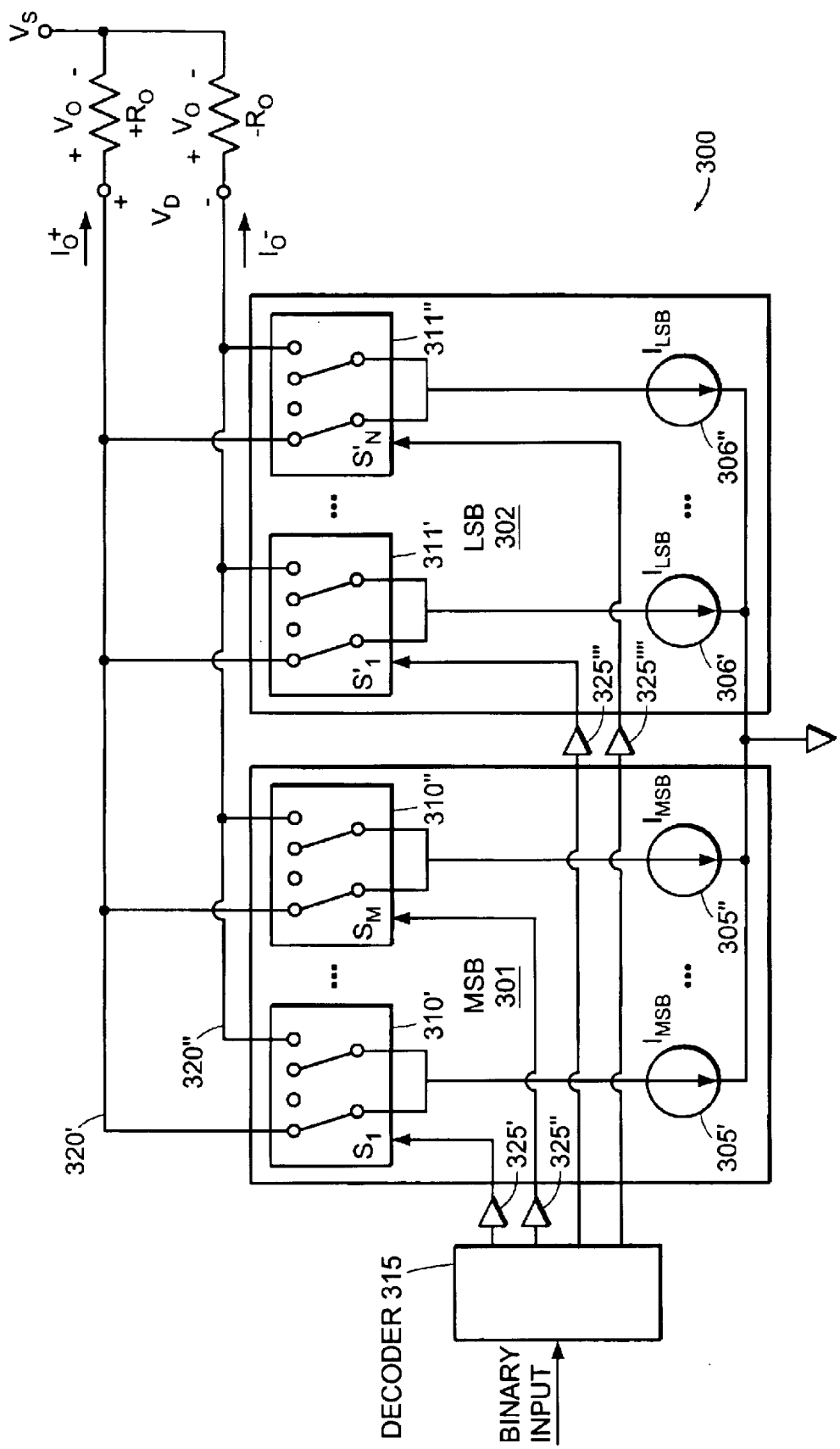
FIGS. 3A–3C are more detailed schematic circuit diagrams of one embodiment of the segmented current-mode DAC shown in FIG. 2.

Generally, there is an unavoidable time delay associated with each current leg 203, 204 from the time that a control input is received to the time at which the conducted current has, in response, changed its level and stabilized. This time delay is undesirable, particularly in high-speed applications. Typically, longer time delays occur when a current source is switched from an off state to an on state. To reduce time delays and improve overall responsiveness, some DAC embodiments are configured for operation in a differential mode. As described in more detail below in reference to FIG. 3A, a differential mode DAC allows the current source of each current leg to remain on at all times, regardless of the control input. Accordingly, the substantial time delay related to turning the current source on or off is eliminated.

A differential, segmented current-mode DAC 300 includes an MSB segment 301 and an LSB segment 302 each receiving control inputs from a decoder 315. As with the segments discussed earlier in relation to FIG. 2, similar segments are shown here in more detail, each including a respective current source and a controllable switch. The MSB segment 301 includes M MSB current sources 305', 305" (generally 305). Each of the M current sources 305 is coupled at one end to an electrical ground and at the other end to one side of a respective controllable switch 310', 310" (generally 310). Notably, the switches 310 are differential switches. Thus the switch switches the interconnected end of the current source 305 between a first and second position. Each of the two positions are coupled to an electrical power source $V_s$ through respective differential output resistors $+R_O$ and $-R_O$. The switches 310 receive a control input from a decoder 315. In some embodiments, the decoder 315 outputs are coupled to the switches 310 through respective buffers and/or drivers 325', 325", 325''', 325'''' (generally 325).

Similarly, The LSB segment 302 includes N LSB current sources 306', 306" (generally 306). Each of the N current sources 306 is coupled at one end to an electrical ground and at the other end one side of a respective controllable differential switch 311', 311" (generally 311). Further, the switches 311 receive an LSB control input from a decoder 315. The interconnection of the LSB current sources 306 to the supply $V_s$ through the switches 311 is similar to that described above for the MSB current sources 305 through switches 310. The respective current contributions of the MSB segment 301 and the LSB segment 302 are combined at the differential summing nodes 320', 320". Thus, the total DAC output current flowing through the differential output resistors $+R_O$ and $-R_O$, respectively induces voltages $+V_O$ and $-V_O$. (The + and − symbols indicate the two differential outputs, not that either voltage is positive or negative.) Additionally, a differential voltage, $V_D$, is developed between the two resistors $+R_O$, $-R_O$.

Figure 3B:
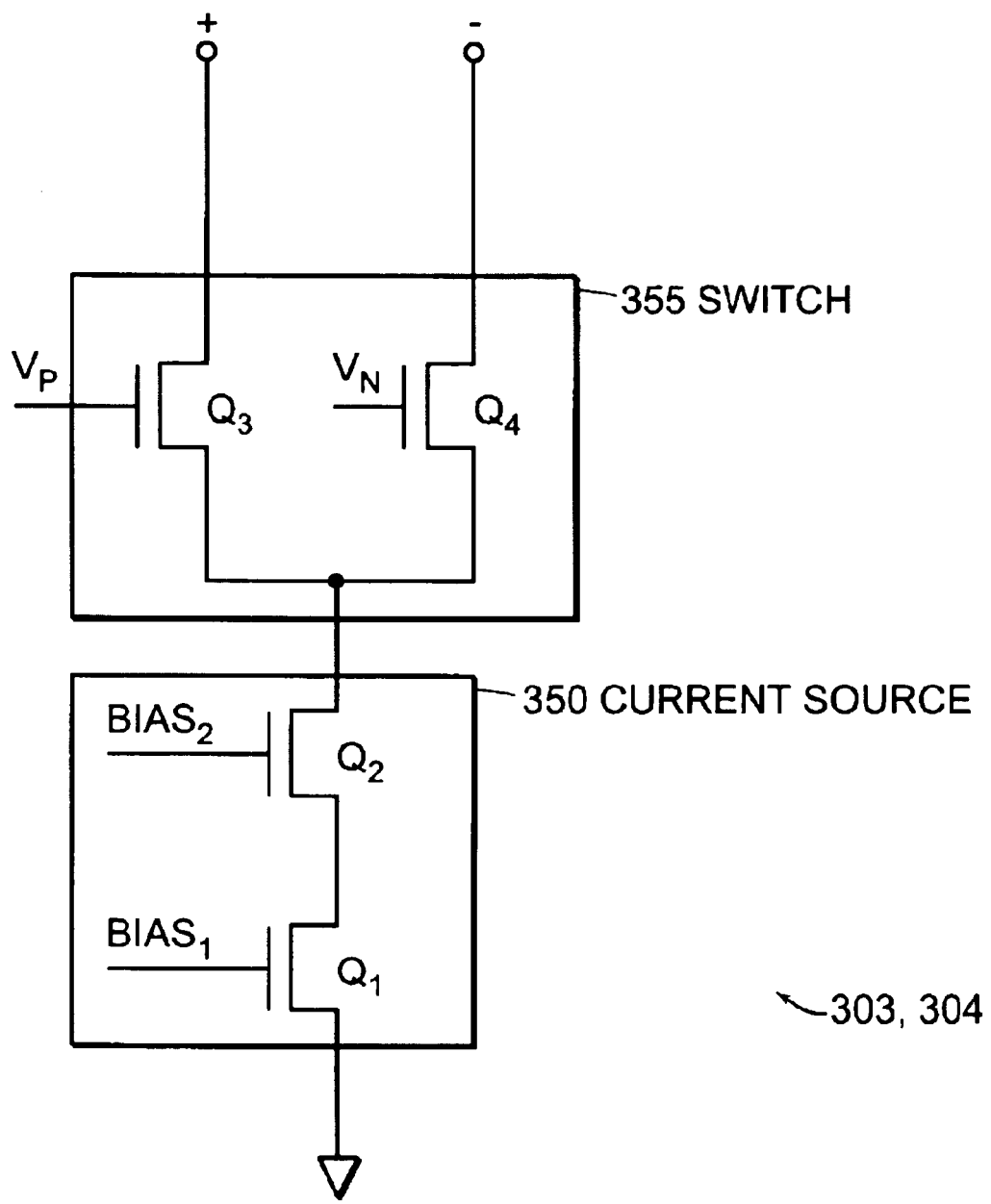

In more detail, referring to FIG. 3B, in one embodiment of a current leg includes a current source 350 and a differential switch 355. The current source can be a transistor, such as a field-effect transistor (FET) $Q_1$. Using a FET, one of the drain and source terminals is coupled to the switch 355 and the other of the drain and source terminals is coupled to an electrical ground. A bias voltage BIAS1 is applied to the gate terminal of $Q_1$ to set the quiescent current level of the source. For improved performance, a second transistor $Q_2$ can be optionally added to the current source 350 in a similar configuration, as shown. A second bias voltage BIAS2 is applied to the gate of the second transistor $Q_2$ to adjust the total current level of the source. In this manner, the second transistor $Q_2$, when combined with the first transistor $Q_1$, forms a cascode device, or cascode current source.

The respective current sources can be formed using transistors. The transistors can be BJT devices, or FET devices, such as a PFET, NFET, JFET, MOSFET. The particular value of current depends on the particular device parameters as well as the designed volt-ampere operating point of the transistor. Additionally the current source can include combinations of transistors, and operational amplifiers.

In one embodiment, differential switch 355 includes two switching transistor switches $Q_3$, $Q_4$. One of the drain and source terminals of each of the switching transistors $Q_3$, $Q_4$ is connected to one end of the current source. The other of the drain and source terminals of each of the switching transistors $Q_3$, $Q_4$ is connected to the supply $V_s$ through the respective differential output resistor $+R_O$, $-R_O$. The transistors $Q_3$, $Q_4$ can be operated in either linear (triode) or saturation mode. The control input from the decoder 315 is applied to the gate terminals of the switching transistors $Q_3$, $Q_4$ thereby switching one of the transistors to a conducting, or ON state and the other transistor to a non-conducting, or OFF state. Importantly, one of the two switching transistors $Q_3$, $Q_4$ is always conducting, but only one of the switching transistors $Q_3$, $Q_4$ is conducting at a time. In this manner, the coupled current source will remain on, but the current will be selectively conducted through one of the two switching transistors $Q_3$, $Q_4$. This current source-switch combination can be used for all of the current legs of the MSB segment 301, the LSB segment 302 or both of the MSB and LSB segments 301, 302. The devices of the LSB segment 302 would be 1/N the size of those of the MSB segment. Those skilled in the art will note that although metal-oxide-semiconductor FET (MOSFET) transistors are schematically represented in FIGS. 3B and 3C and referred to in the discussions, as well as the rest of this document, such DACs can also be constructed with other devices such as junction FETs (JFET), PFETs, NFETs, bipolar junction transistors, etc., and this document applies to them also in terms of its scope.

Figure 3C:
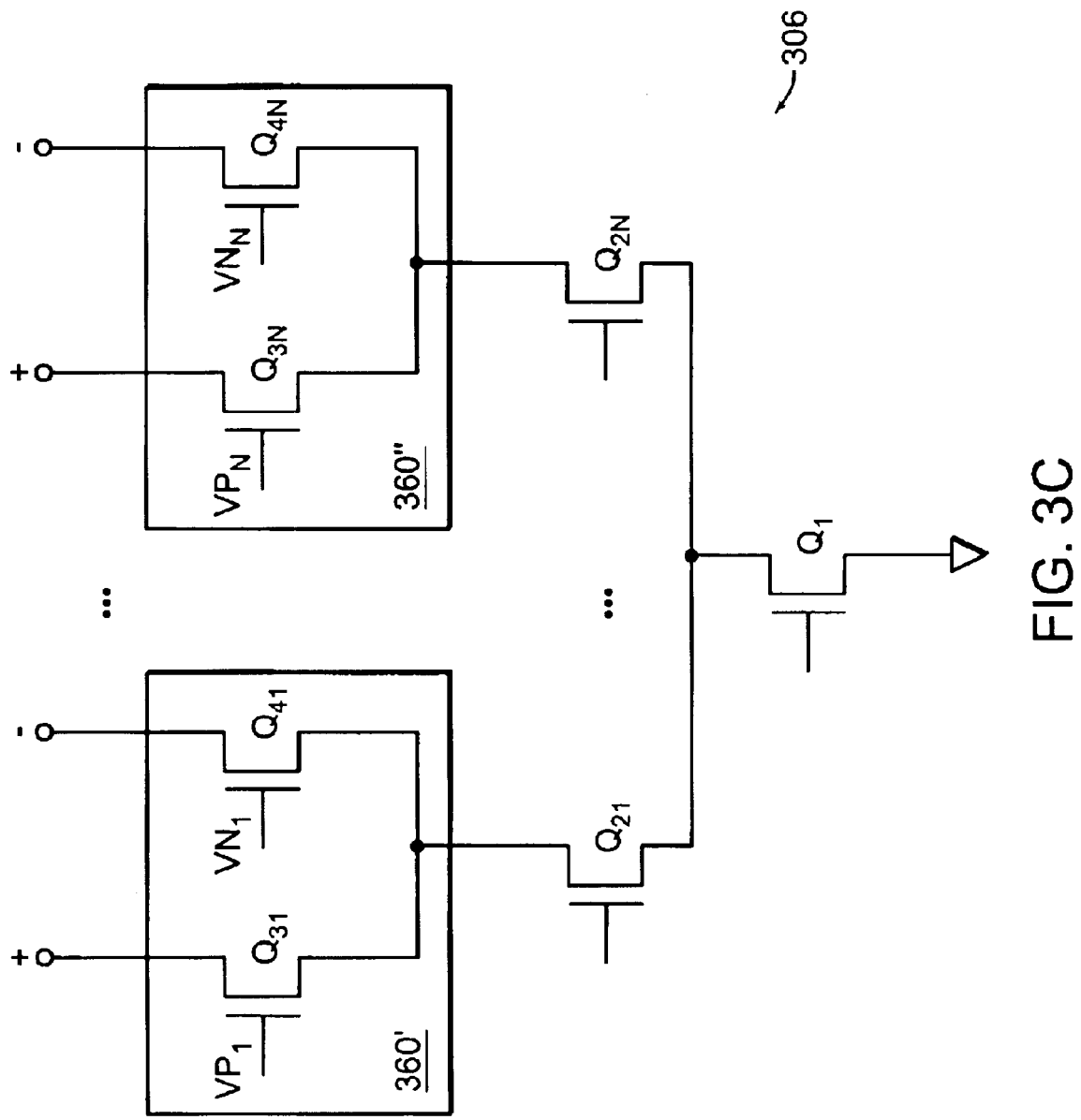

An alternative embodiment of an LSB segment is shown in FIG. 3C. As described above, the LSB segment includes N current legs, each current leg including a current source and a switch. Notably, each of the N current legs are similar to the current leg shown in FIG. 3B, except that the N current sources share one common transistor $Q_1$. Hence, the two-transistor current source 350 of FIG. 3B is effectively split, with each of the N current legs including a respective second current source transistor $Q_{21} \ldots Q_{2N}$. Each transistor $Q_{21}$-$Q_{2N}$ is coupled to one end of a common current source transistor $Q_1$. The other end of the current source transistor $Q_1$ is coupled to a ground potential. In this embodiment, transistor $Q_1$ of an LSB segment is identical in size to $Q_1$ of an MSB segment, as both are carrying the same value of current. The other transistors $Q_2$, $Q_3$, and $Q_4$ are each N times smaller than $Q_1$, as each is carrying a lesser current, or 1/N of the MSB current value $I_{MSB}$.

The difference in device sizes between the MSB current legs of FIG. 3B and the LSB current legs of either FIGS. 3B and 3C leads to further dynamic mismatches. In particular, it is virtually impossible to construct switching signal drivers (e.g., drivers 325 of FIG. 3A) to provide switching control inputs to both the MSB 301 and LSB 302 current legs at the same speed, because of the different electrical loads presented from the differently sized transistors. Although the driver circuits can be scaled in size appropriately, it is harder to scale the parasitic effects between the driver circuits and the current source switches 310, 311 by the same amount. Notably, it is also virtually impossible to route the differential outputs from the source to the switches 310, 311 so that each of the MSB and LSB current sources sees the same time constant. Moreover, it is difficult to equalize the parasitic effects on the internal nodes of the current sources. In particular, it is difficult to equalize the internal node between transistors $Q_1$ and $Q_{21}$-$Q_{2N}$ of FIG. 3C, because the internal node between transistors $Q_1$ and $Q_2$ of FIG. 3B is much smaller than the internal node between transistors $Q_1$ and $Q_{21}$-$Q_{2N}$. Still further, the routing of the switching control inputs to each of the multiple switches $Q_{31}$-$Q_{3N}$, $Q_{41}$-$Q_{4N}$ of FIG. 3C will be different than the routing to switches $Q_3$, $Q_4$ of FIG. 3B. The above described factors all contribute to significant dynamic mismatches between the current sources.

An improved, high-dynamic linearity segmented current-mode DAC 400 that resolves the design challenges described above is shown in FIGS. 4A–4D. Broadly, the improved segmented DAC 400 uses a common design, or architecture, for each of its different segments (i.e., the structure of the MSB segment 401 is common to the structure of the LSB segment 402). Thus, although the two segments 401, 402 are weighted differently, they use a common architecture. Using a common architecture for all of the segments substantially reduces and/or eliminates dynamic mismatches between the different weighted segments, because the mechanisms that gave rise to the mismatches are virtually eliminated.

The common architecture is obtained by first replacing each current leg of the MSB segment 401 with N parallel current branches of devices sized to 1/N. That is, sized to match the sizes of the LSB devices. Each current leg of the LSB segment 402 is similarly replaced with like N parallel current branches. To allow for the reduced current output required of each LSB current leg, N−1 current branches are connected to a dump node rather than to the output.

Figure 4A:
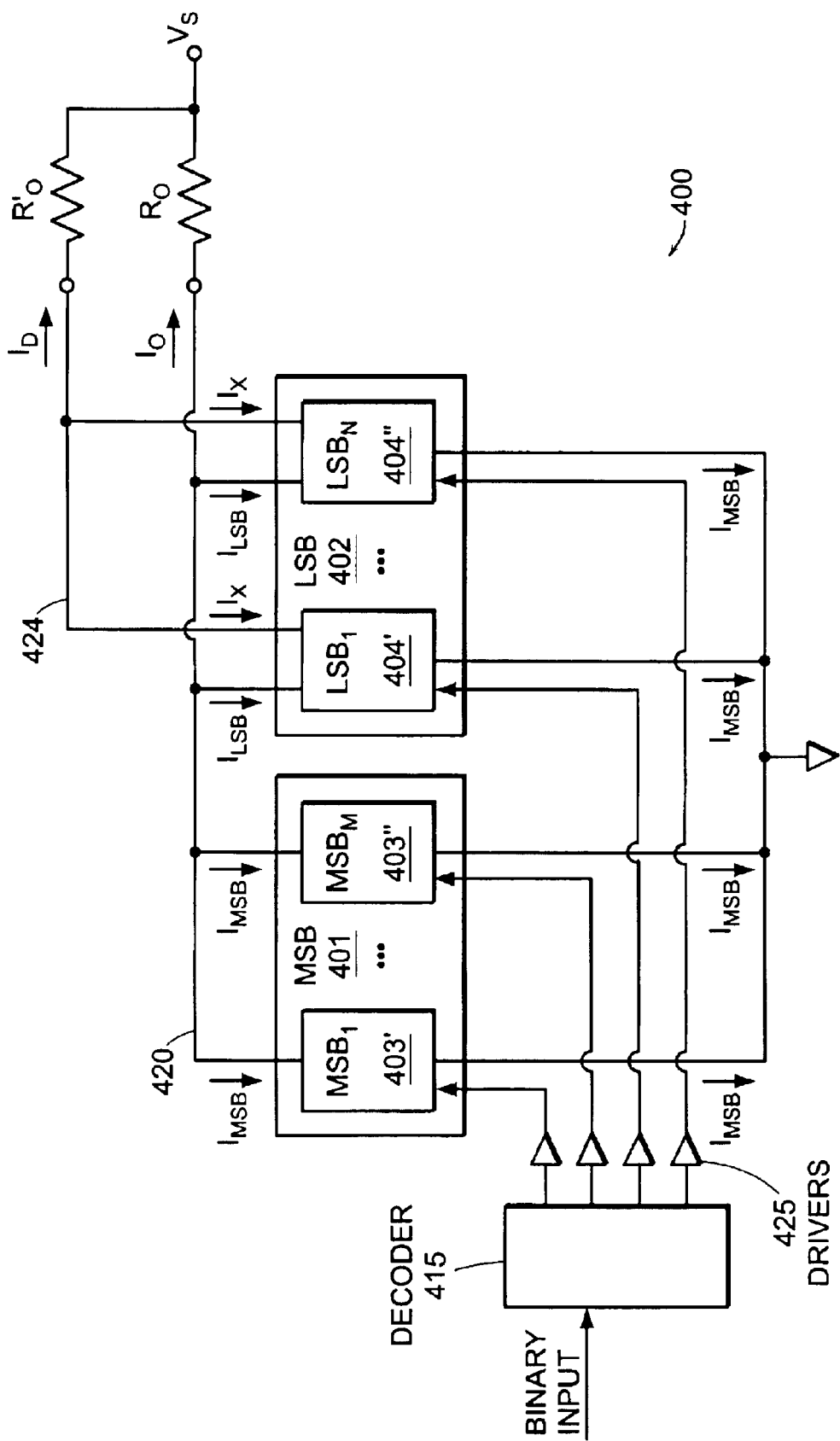
FIGS. 4A–4D are schematic circuit diagrams of a high-dynamic linearity segmented current mode DAC.

A schematic diagram of an exemplary, improved segmented DAC 400 having two segments is shown in FIG. 4A. The improved DAC 400 shown in FIG. 4A is similar to the segmented DAC 200 discussed in relation to FIG. 2. One notable difference in FIG. 4A, however, is the presence of a dumping node 424. The improved DAC 400 similarly includes an MSB segment 401 and an LSB segment 402, each similarly including respective current legs: MSB current legs 403', 403" (generally 403) and LSB current legs 404', 404" (generally 404). Further, a decoder 415 similarly receives a digital word and converts it to two thermometer coded outputs that are similarly routed to respective current legs 403, 404 through respective drivers 425. Similarly, the control inputs received by the current legs 403, 404 selectively switch the respective current leg 403, 404 between ON and OFF according to the input digital word. Further, one end of each of the current legs 403, 404 is similarly coupled together and to a common potential (e.g., electrical ground). Still further, the other end of the MSB and LSB current legs 403, 404 are similarly coupled together at a summing node 420 and to an electrical source $V_s$ through a resistor $R_O$.

Figure 2:
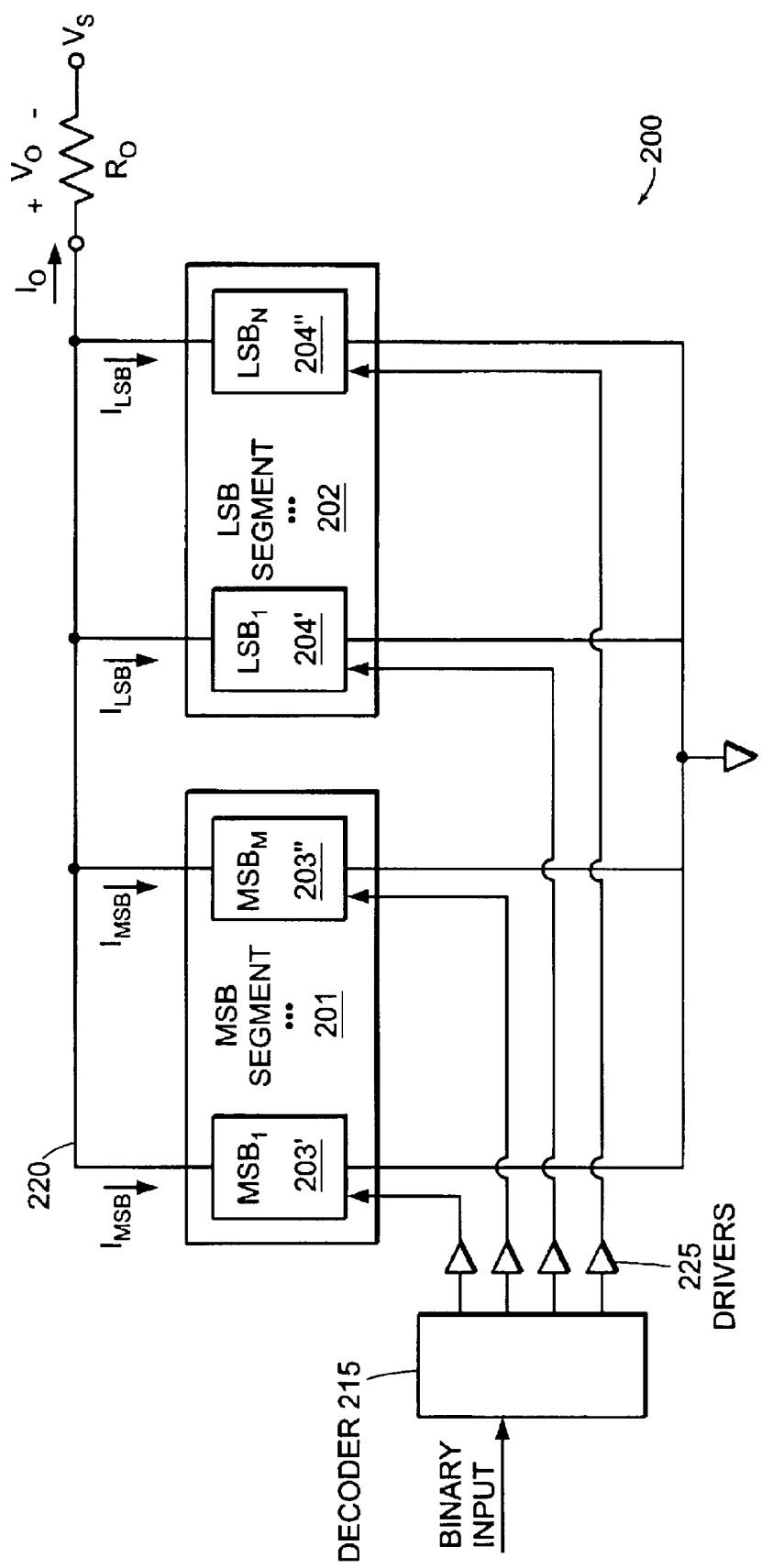
FIG. 2 is a schematic circuit diagram of a two-segment segmented current-mode DAC.

In contrast with the DAC 200 of FIG. 2, however, the LSB current legs 404 of the improved DAC 400 are further coupled to the dump node 424. Thus, the LSB current legs 404 have three terminals, a first terminal coupled to the common, or ground potential along with the other current legs 403, 404; a second terminal coupled to the source $V_s$ through a summing node 420; and a third terminal coupled to the dump node 424. The dump node 424, in turn, can also be connected to the source $V_s$ through a similar output resistor $R_O'$. In other embodiments, the dump node could be an electric ground, such as a ground plane of a circuit board or semiconductor, or a supply potential, such as a supply plane or supply rail of a circuit board or semiconductor.

In operation, when the LSB current leg 404 is switched ON by the decoder 415, the current leg 404 conducts a first current $I_{LSB}$ relative to the summing node 420. The LSB current leg 404 also conducts a total current of $I_{MSB}$ relative to the common, ground potential. Finally, because the sum of the currents into the LSB current leg 404 must be equal to the sum of currents exiting the current leg 404, a resulting current, or "dump" current, $I_D$, is conducted with respect to the dump node. The dump current $I_D$ is thus the difference between the other two currents (i.e., $I_{MSB}$−$I_{LSB}$). Notably, the dump current does not contribute to the DAC output. In that sense, the dump current is wasted, representing an inefficiency. The inefficiency due to the wasted current is insubstantial in comparison to the total current consumption of the DAC. Current is only dumped in the LSB segment, while current consumption of the rest of the DAC, such as MSB segment and the decoder remains unchanged.

Figure 4B:
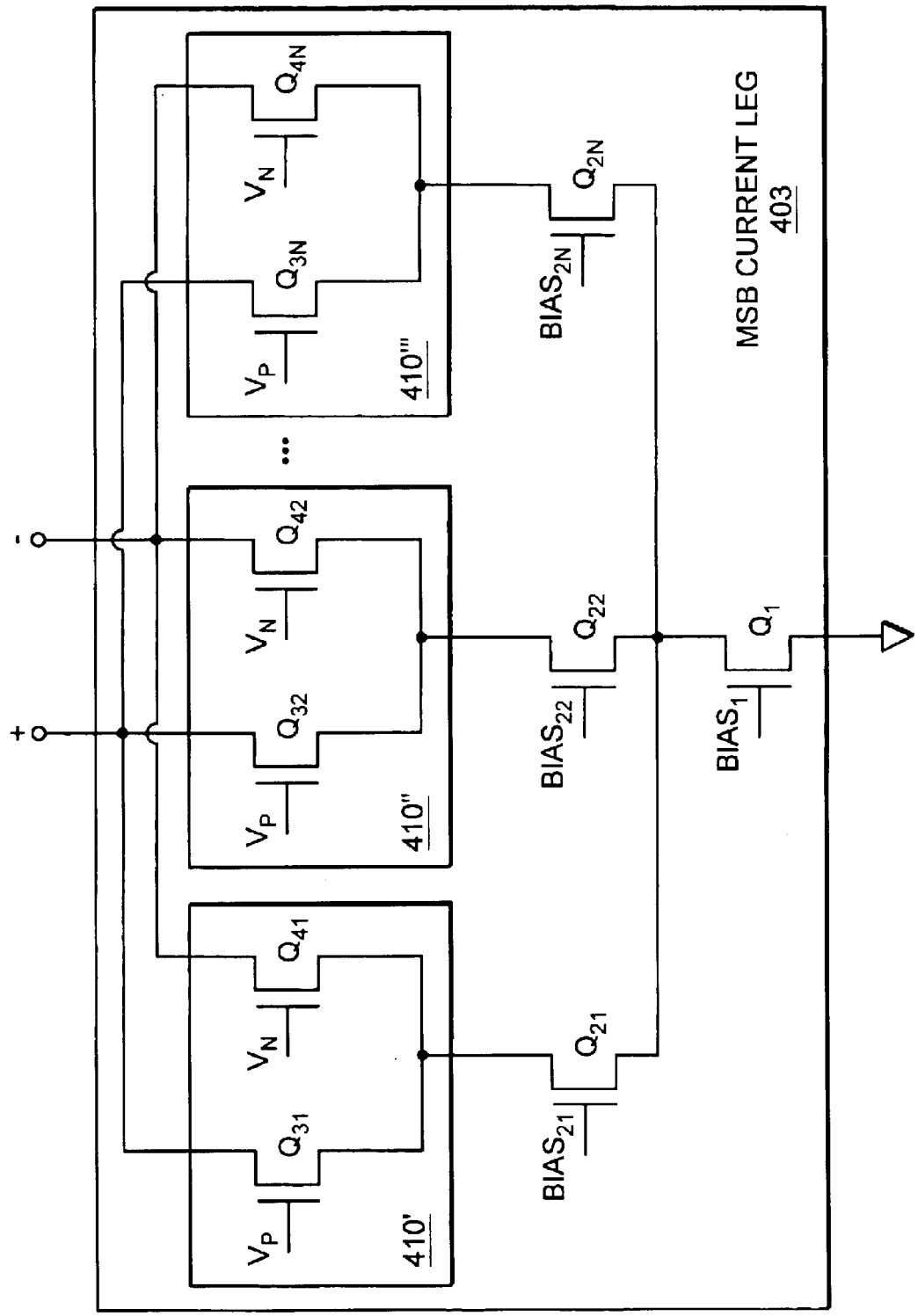

As described above, an advantageous feature of the improved DAC 400 is a common design for all of the MSB current legs 403 and the LSB current legs 404. Turning first to the MSB current leg 403, a more detailed schematic diagram of one embodiment of an improved MSB current leg is shown in FIG. 4B. The MSB current leg 403 is similar to the MSB current leg 303, 304 describe in relation to FIG. 3B. The differences, however, are provided within the current leg 403 in that its internal structure includes N identical parallel current branches, rather than the single current branch of current leg 303, 304.

More particularly, the current leg 403 of the improved DAC 400 includes one transistor $Q_1$ setting the current leg's current value. One end of the transistor $Q_1$ is coupled to a common node, or ground potential. The other end of the transistor $Q_1$ is coupled through N, respective second transistors $Q_2$, to one end of N, respective parallel switches 410', 410", 410''' (generally 410). As described earlier, in one embodiment, the switches 410 are differential transistor switches including two transistors $Q_3$, $Q_4$ alternately switching between a positive and negative current leg of a differential output. As shown, each of the positive outputs of the switches 410 are coupled together and further to the positive output current leg. Similarly, each of the negative outputs of the switches 410 are coupled together and further to the negative output current leg. Importantly, each of the N switches receive the same control input from the decoder 415. That is, the MSB current leg has only one control input. The control input is split internally and routed to the switches of the N current branches of the MSB current leg 403. Additionally, a first bias voltage $BIAS_1$ is applied to the gate terminal of transistor $Q_1$. Similarly, N respective bias voltages $BIAS_{21}$ ... $BIAS_{2N}$ are applied to the respective gate terminals of the N transistors $Q_{21}$-$Q_{2N}$.

In operation, the MSB current leg 403, when switched on, conducts an MSB current $I_{MSB}$ with respect to the source node. Internally, the MSB current is split equally among the N internal current branches, such that each current branch carries approximately $I_{MSB}/N$. The N current branch currents are then recombined, such that the MSB current $I_{MSB}$ flows through the common transistor $Q_1$.

Figure 4C:
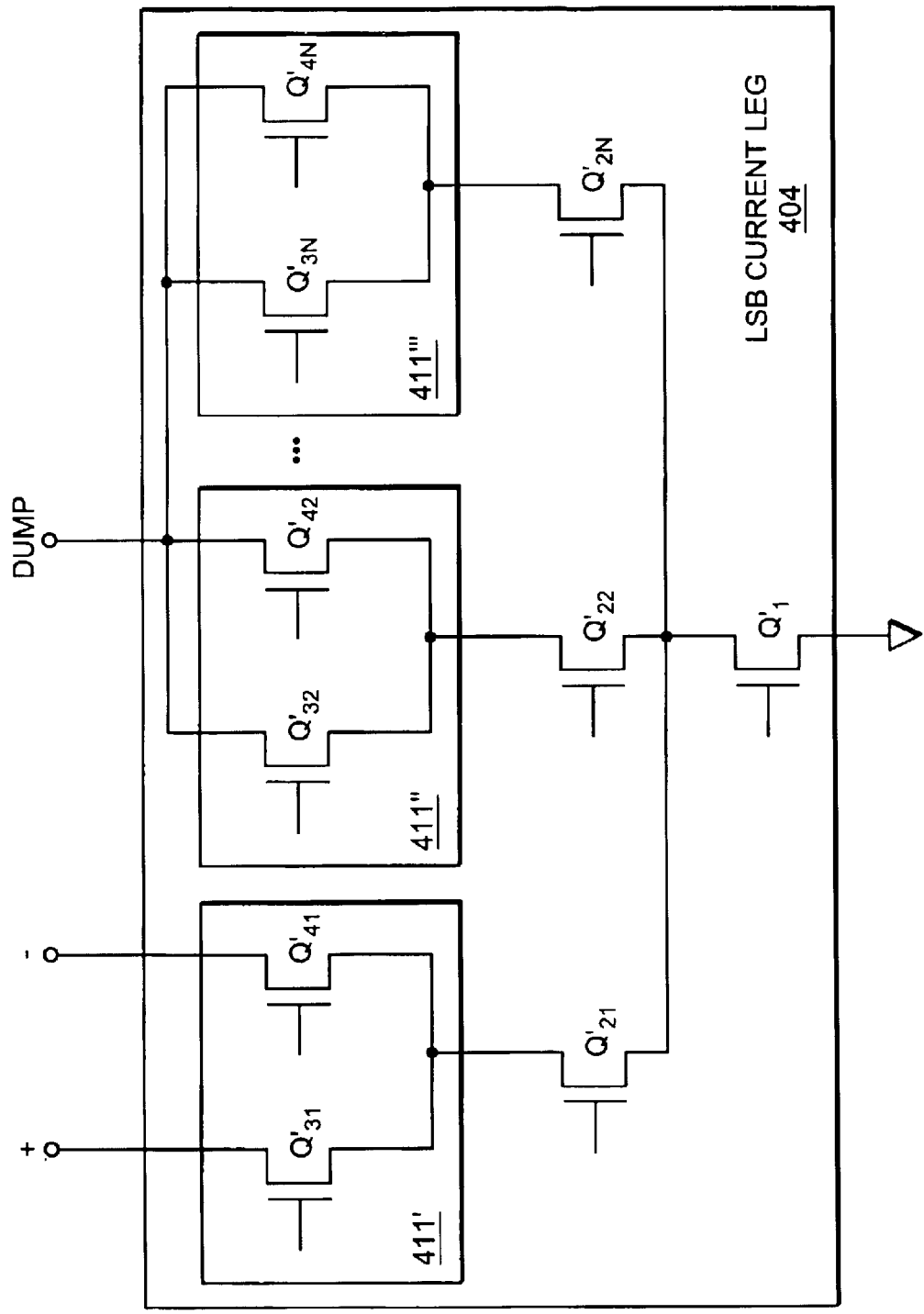

Turning next to the LSB current leg 404, a more detailed schematic diagram of one embodiment of an improved LSB current leg is shown in FIG. 4C. The basic structure of FIG. 4B is repeated. That is, the LSB current leg 404 includes one current source transistor $Q'_1$ having one end coupled to a common node, or electrical ground and another end connected to N current switches through N transistors $Q'_{21}$-$Q'_{2N}$. Notably, however, only one of the switches (e.g., 411') is connected to the differential output. Both sides of all of the remaining switches 411 are coupled at one end to the dump node VD. As described above in relation to FIG. 4B, each of the N switches 411 receives the same control input that is routed internally to the individual switches. Also, as described above, the gate terminals of each of the current source transistors $Q_1$, $Q_2$ are suitably biased.

Figure 4D:
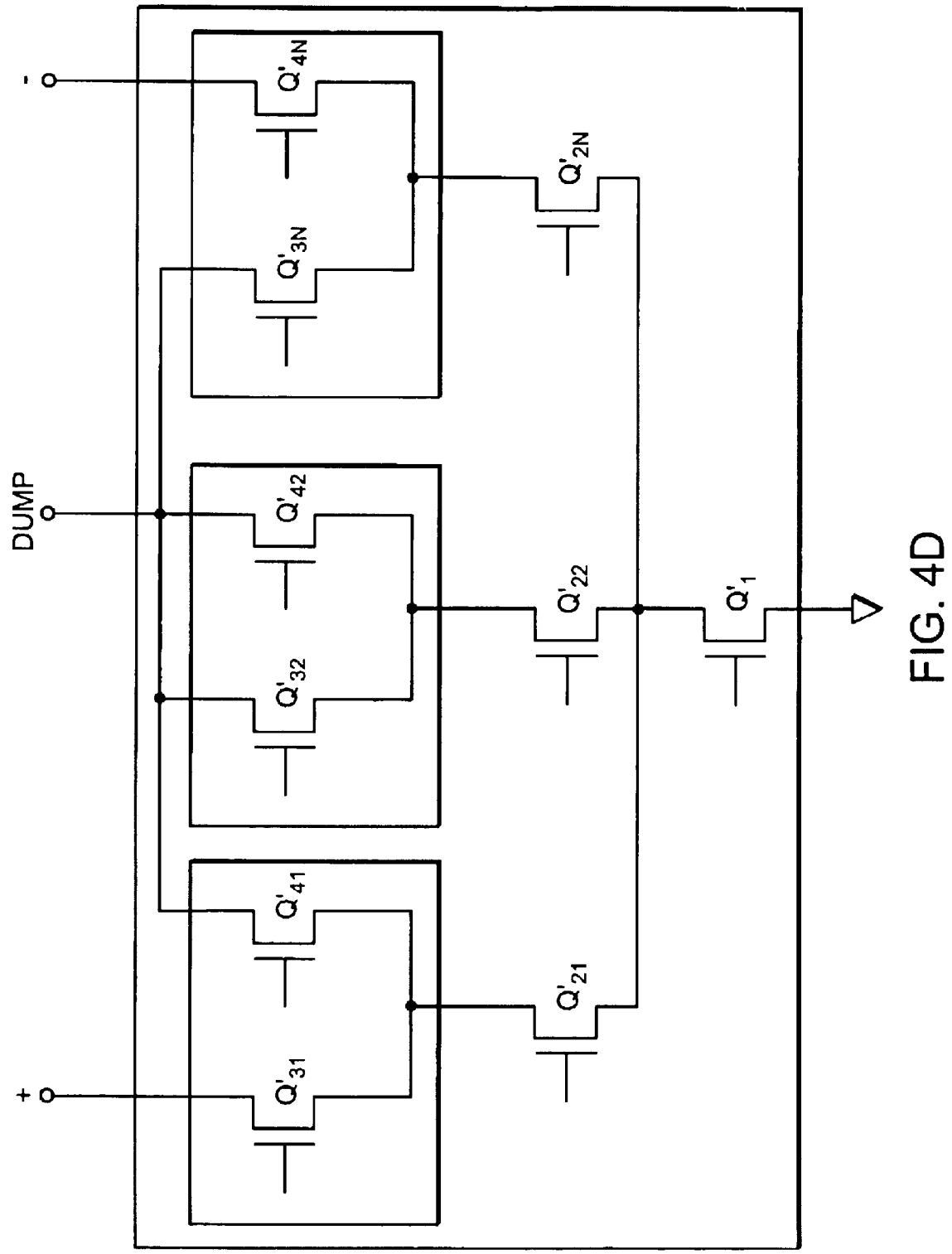

Depending upon a particular implementation of the LSB current segment 404, certain modifications may improve matching and/or facilitate fabrication. For example, the one switch coupled to the differential output was shown as the first switch 411'. In general, any one of the N switches can be coupled to the differential output, the remaining switches being coupled to the dump node. Alternatively, as shown in FIG. 4D, one half of one of the differential switches (e.g., a positive half) can be coupled to the positive half of the differential output, and one half of one of the other differential switches (e.g., a negative half) can be coupled to the negative half of the differential output. The remaining switches and half switches are all coupled to the dump node.

To further improve similarities, a dump node can be included in the MSB current leg. Here the dump node would not necessarily be connected to anything, but would serve to equalize static matching and parasitic effects.

Additionally, a load can be provided at the dump node that is similar, or equalized to the loads appearing at the differential output. This modification further improves the similarities between the current sources in the LSB segments 405 and the current sources in the MSB segments 403.

The net result of splitting each of the M MSB current legs 403 and N LSB current legs 404 internally, each having N identical internal current branches, is to equalize the relative parasitic effects of each of the current legs 403, 404. Thus, the parasitic effects on the internal node between $Q_1$ and $Q_{21}$-$Q_{2N}$ are substantially identical for both the MSB current legs 403 and the LSB current legs 404. The above described factors reduce the dynamic mismatches between the MSB segments and the LSB segments thereby greatly improving the dynamic linearity of the DAC 400.

Other devices can be optionally included to improve static linearity. These devices can include passive and/or active compensating circuits. Passive compensating circuits can include resistive, capacitive, and inductive elements. For example, the passive elements can be fabricated, then later trimmed or otherwise adjusted during a calibration procedure. Active compensating circuits can include transistors and/or operational amplifiers. In some embodiments, the active circuits can also include passive circuit elements. For example, an active circuit can be provided by a transistor, or multi-transistor circuit. Accordingly, a bias network biases transistor of the active circuit at an advantageous quiescent operating point. The operating point thus provides a current contribution that tends to limit and/or enhance the current value of the respective current source. For example, the bias circuit can bias the gate of a FET transistor, thereby controlling the drain/source current value.

In general, the device can be implemented in a semiconductor on a single integrated circuit. Alternatively, the device can be implemented in a semiconductor on more than one interconnected integrated circuits. Further, the device can be implemented using combinations of one or more semiconductor integrated circuits with lumped circuit components. The semiconductor can be P-type substrate, an N-type substrate, and/or a MOS type substrate.

While this invention has been particularly shown and described with references to preferred embodiments thereof, it will be understood by those skilled in the art that various changes in form and details may be made therein without departing from the scope of the invention encompassed by the appended claims.

What is claimed is:

1. A segmented, current-mode Digital-to-Analog Converter (DAC) comprising:
   a summing node;
   a dump node;
   a control input;
   a Most Significant Bit (MSB) current leg coupled to the summing node, the MSB current leg conducting a first current relative to the summing node in response to the control input; and
   a Least Significant Bit (LSB) current leg coupled to the summing node, the LSB current leg conducting a second current relative to the summing node in response to the control input and conducting a wasted current relative to the dump node, the DAC providing an output including the first and second currents and not including the wasted current.

2. The DAC of claim 1, wherein the summing node comprises a positive source node and a negative source node.

3. The DAC of claim 1, further comprising a second MSB current leg coupled to the summing node, the second MSB segment conducting a first current in response to the control input.

4. The DAC of claim 1, wherein the dump node is coupled to an electrical ground.

5. The DAC of claim 1, wherein the dump node is coupled to an electrical power supply.

6. The DAC of claim 1, further comprising a decoder receiving a digital word and generating the control input in response thereto.

7. The DAC of claim 1, wherein the MSB current leg and the LSB current leg have substantially the same internal architecture, but for the dump node connection.

8. The DAC of claim 1, wherein:
   the MSB current leg comprises:
      a first plurality of current branches coupled together at one end, and coupled to the summing node at the other end, each current branch conducting a respective portion of the first current; and the LSB current leg comprises:
a second plurality of current branches coupled together at one end, at least one current branch coupled to the summing node at its other end, the remaining current branches coupled to the dump node at their other ends, each current branch conducting a respective portion of the first current.

9. The DAC of claim 8, wherein at least one of the MSB current source and the LSB current source comprises a transistor.

10. The DAC of claim 9, wherein the transistor is selected from the group including: a Field-Effect Transistor (FET); a p-type FET; an n-type FET; a junction FET; a metal-oxide-semiconductor FET; and a bipolar junction transistor.

11. The DAC of claim 8, wherein the first and second pluralities of current branches have the same number of respective current branches.

12. The DAC of claim 8, wherein each current branch of the first plurality of current branches comprises a respective MSB switch coupled between the summing node and the MSB current source, the MSB switch coupling the summing node to the MSB current source in response to the control input.

13. The DAC of claim 12, wherein the MSB switch comprises a transistor switch.

14. The DAC of claim 13, wherein the transistor is selected from the group including: a Field-Effect Transistor (FET); a p-type FET; an n-type FET; a junction FET; a metal-oxide-semiconductor FET; and a bipolar junction transistor.

15. The DAC of claim 8, wherein the MSB current source comprises an MSB cascode device.

16. The DAC of claim 8, wherein each current branch of the second plurality of current branches comprises a respective LSB switch coupled between the respective node and the LSB current source, the LSB switch coupling the respective node to the LSB current source in response to the control input.

17. The DAC of claim 8, wherein the LSB current source comprises an LSB cascode device.

18. The DAC of claim 8, wherein the LSB switch comprises a transistor.

19. The DAC of claim 18, wherein the transistor is selected from the group including: a Field-Effect Transistor (FET); a p-type FET; an n-type FET; a junction FET; a metal-oxide-semiconductor FET; and a bipolar junction transistor.

20. A digital-to-analog converting method for generating a linear, high-speed analog output signal comprising:
receiving a control input;
conducting in a Most Significant Bit (MSB) current leg, a first current relative to a summing node in response to receiving the control input;
conducting in a Least Significant Bit (LSB) current leg, a second current relative to the summing node in response to receiving the control input; and
conducting in the LSB current leg, a wasted current relative to a dump node the DAC providing an output including the first and second currents and not including the wasted current.

21. The digital-to-analog converting method of claim 20, wherein the first and second currents are differential-mode currents.

22. The digital-to-analog converting method of claim 20, further conducting, in response to the control input, a first current in a second MSB current leg, the second MSB current leg also coupled between a source node and a summing.

23. The digital-to-analog converting method of claim 20, wherein dumping a portion of the second current comprises dumping the portion of current to electrical ground.

24. The digital-to-analog converting method of claim 20, wherein dumping a portion of the second current comprises dumping the portion of current to a supply.

25. The digital-to-analog converting method of claim 20, further comprising:
receiving a digital word;
decoding the received digital word; and
generating a control input in response thereto.

26. The digital-to-analog converting method of claim 20, further comprising:
providing an MSB current source coupled between the source node and the summing node;
dividing the first current across a first plurality of current branches coupled between the source node and the MSB current source; and
providing an LSB current source coupled between the source node and the summing node; and
dividing the second current across a second plurality of current branches, at least one of the second plurality of current branches coupled between the source node and the LSB current source, the remaining current branches of the second plurality of current branches coupled between the dump node and the LSB current source.

27. The digital-to-analog converting method of claim 26, wherein providing at least one of the MSB current source and the LSB current source comprises providing a suitably biased transistor.

28. The digital-to-analog converting method of claim 27, wherein the transistor is selected from the group including: a Field-Effect Transistor (FET); a p-type FET; an n-type FET; a junction FET; a metal-oxide-semiconductor FET; and a bipolar junction transistor.

29. The digital-to-analog converting method of claim 26, wherein the first and second pluralities of current branches have the same number of respective current branches.

30. The digital-to-analog converting method of claim 26, further comprising:
switching the first plurality of current branches between a conducting and nonconductive mode responsive to the control input; and
switching the second plurality of current branches between a conducting and non-conductive mode responsive to the control input.

31. The digital-to-analog converting method off claim 30, wherein switching the first and second pluralities of current segments comprises operating a transistor as a switch.

32. The digital-to-analog converting method of claim 31, wherein the transistor is selected from the group including; a Field-Effect Transistor (FET); a p-type FET; an n-type FET; a junction FET; a metal-oxide-semiconductor FET; and a bipolar junction transistor.

33. The digital-to-analog converting method of claim 26, further comprising:
coupling, in series with the MSB switch and the MSB current source, an MSB cascode device.

34. The digital-to-analog converting method of claim 26, further comprising:

coupling, in series with the LSB switch and the LSB current source, an LSB cascode device.

35. A digital-to-analog converter comprising:

means for receiving a control input;

means for conducting, in response to the received control input, a first current in a Most Significant Bit (MSB) current leg;

means for conducting, in response to the received control input, a second current in a Least Significant Bit (LSB) current leg;

means for conducting a wasted current in the LSB current leg; and means for providing a DAC output including the first and second currents, and not including the wasted current.

* * * * *